(12) United States Patent
Noorbakhsh et al.

(10) Patent No.: US 9,540,731 B2
(45) Date of Patent: Jan. 10, 2017

(54) RECONFIGURABLE MULTI-ZONE GAS DELIVERY HARDWARE FOR SUBSTRATE PROCESSING SHOWERHEADS

(75) Inventors: Hamid Noorbakhsh, Fremont, CA (US); James D. Carducci, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 578 days.

(21) Appl. No.: 12/899,062

(22) Filed: Oct. 6, 2010

(65) Prior Publication Data
US 2011/0162800 A1 Jul. 7, 2011

Related U.S. Application Data

(60) Provisional application No. 61/266,820, filed on Dec. 4, 2009.

(51) Int. Cl.
C23C 16/455 (2006.01)
H01J 37/32 (2006.01)

(52) U.S. Cl.
CPC ..... *C23C 16/45565* (2013.01); *H01J 37/3244* (2013.01); *H01J 37/32091* (2013.01); *H01J 37/32449* (2013.01); *Y10T 29/49716* (2015.01)

(58) Field of Classification Search
CPC ........... C23C 16/45565; C23C 16/45563; C23C 16/45568; C23C 16/45587
See application file for complete search history.

(56) References Cited

U.S. PATENT DOCUMENTS 5,746,875 A * 5/1998 Maydan et al. ......... 156/345.34
6,123,775 A * 9/2000 Hao ................... C23C 16/45572
118/715

(Continued)

FOREIGN PATENT DOCUMENTS

DE 10045958 A1 * 4/2002
EP 1970468 A1 * 9/2008

(Continued)

OTHER PUBLICATIONS

"Plenum". The Free Online Dictionary. "http://www.thefreedictionary.com/plenum".*

(Continued)

*Primary Examiner* — Jeffrie R Lund
*Assistant Examiner* — Yuechuan Yu
(74) *Attorney, Agent, or Firm* — Moser Taboada; Alan Taboada

(57) ABSTRACT

Reconfigurable showerheads used in process chambers for substrate processing are provided herein. In some embodiments, a reconfigurable showerhead may include a body having one or more plenums disposed therein; and one or more inserts configured to be disposed within the one or more plenums, wherein the one or more inserts divide the reconfigurable showerhead into a plurality of zones. In some embodiments, a substrate processing system may include a process chamber having a reconfigurable showerhead coupled to a gas supply for providing one or more process gases to the process chamber, the reconfigurable showerhead including a body having one or more plenums disposed therein and one or more inserts configured to be disposed within the one or more plenums, wherein the one or more inserts divide the reconfigurable showerhead into a plurality of zones.

16 Claims, 13 Drawing Sheets

(56) References Cited

U.S. PATENT DOCUMENTS

| | | | |
|---|---|---|---|
| 2003/0019428 A1 * | 1/2003 | Ku et al. | 118/715 |
| 2003/0070761 A1 * | 4/2003 | Turlot et al. | 156/345.47 |
| 2004/0149699 A1 * | 8/2004 | Hofman et al. | 219/121.43 |
| 2004/0255855 A1 | 12/2004 | Selvamanickam et al. | |
| 2006/0219362 A1 * | 10/2006 | Han et al. | 156/345.33 |
| 2007/0158026 A1 * | 7/2007 | Amikura | 156/345.34 |
| 2007/0163440 A1 | 7/2007 | Kim et al. | |
| 2007/0181181 A1 | 8/2007 | Mizusawa | |
| 2007/0215284 A1 | 9/2007 | Oyabu | |
| 2007/0256786 A1 * | 11/2007 | Zhou et al. | 156/345.34 |
| 2008/0078746 A1 | 4/2008 | Masuda | |
| 2008/0216747 A1 * | 9/2008 | Wieder et al. | 118/723 R |
| 2009/0133631 A1 * | 5/2009 | Wieder | 118/723 R |
| 2009/0272492 A1 | 11/2009 | Katz et al. | |
| 2009/0311869 A1 * | 12/2009 | Okesaku et al. | 438/710 |
| 2013/0149867 A1 | 6/2013 | Masuda | |

FOREIGN PATENT DOCUMENTS

| | | |
|---|---|---|
| JP | 05299382 A * | 11/1993 |
| JP | 08120469 A * | 5/1996 |
| JP | 11016888 A * | 1/1999 |
| KR | 10-2007-0021637 A | 2/2007 |
| WO | WO 2008010520 A1 * | 1/2008 |

OTHER PUBLICATIONS

International Search Report and Written Opinion for mailed Jul. 26, 2011 for PCT Application No. PCT/US2010/057959.
Search Report from the State Intellectual Property Office of the People's Republic of China received for Chinese Patent Application No. 2010800551273.

* cited by examiner

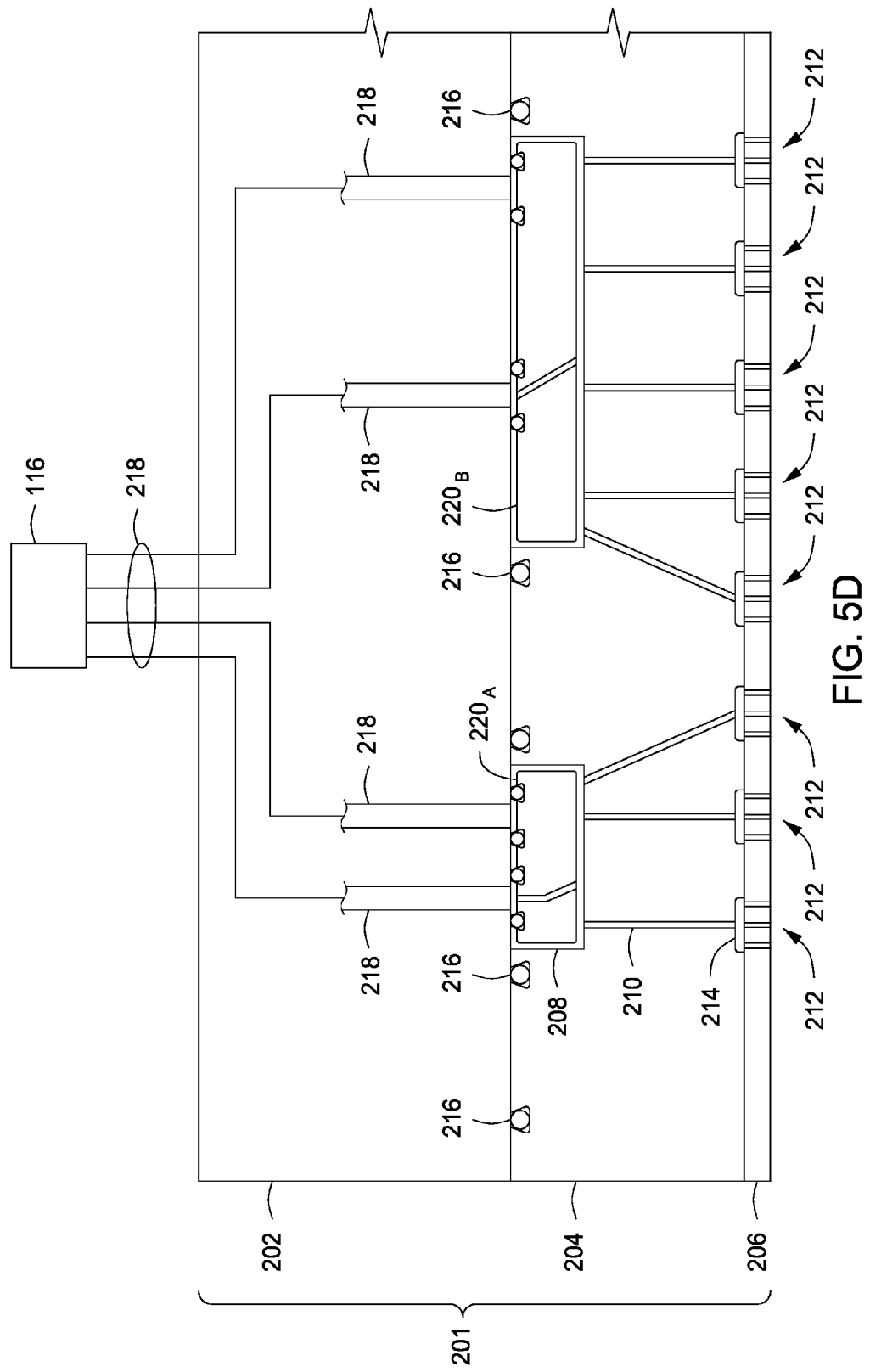

RECONFIGURABLE MULTI-ZONE GAS DELIVERY HARDWARE FOR SUBSTRATE PROCESSING SHOWERHEADS

CROSS-REFERENCE TO RELATED APPLICATIONS

This application claims benefit of U.S. provisional patent application Ser. No. 61/266,820, filed Dec. 4, 2009, which is herein incorporated by reference.

FIELD

Embodiments of the present invention relate to gas distribution showerhead assemblies for use in, for example, semiconductor processing chambers.

BACKGROUND

Semiconductor manufacturing processes utilize a wide variety of gases provided to a process chamber during processing of semiconductor substrates. Many process chambers utilize a "showerhead" type gas distribution assembly to provide processing gases into a semiconductor process chamber (such as an etch chamber or a deposition chamber). Showerheads may have a variety of configurations, such as providing gases to one zone or multiple zones of the process chamber. Such configurations are typically fixed and a showerhead configured to provide gases in one manner (for example, one zone) may not be used to provide gases in one manner (for example, two zones).

The inventors have provided a configurable showerhead to provide gases to the process chamber in one or more zones, as desired.

SUMMARY

Embodiments of the present invention relate to reconfigurable showerheads used in process chambers for substrate processing, such as in the manufacture of electronic devices. The reconfigurable showerhead advantageously provides a plurality of configurations of independent zones for providing process gases to a process chamber within a single, reconfigurable showerhead. The reconfigurable showerhead thus provides a customizable gas distribution apparatus that can advantageously be utilized in place of a plurality of conventional, non-customizable showerheads. The reconfigurable showerhead may further advantageously provide uniform gas distribution across each zone in the showerhead, regardless of the configuration of zones.

In some embodiments, the reconfigurable showerhead includes a body having one or more plenums disposed therein and one or more inserts configured to be disposed within the one or more plenums. In some embodiments, the insert may divide the plenum into a plurality a zones. In some embodiments, the insert may provide uniform distribution of gases within each zone.

In some embodiments, a reconfigurable showerhead may include a body having one or more plenums disposed therein; and one or more inserts configured to be disposed within the one or more plenums, wherein the one or more inserts divide the reconfigurable showerhead into a plurality of zones.

In some embodiments, a substrate processing system may include a process chamber having a reconfigurable showerhead coupled to a gas supply for providing one or more process gases to the process chamber, the reconfigurable showerhead comprising a body having one or more plenums disposed therein and one or more inserts configured to be disposed within the one or more plenums, wherein the one or more inserts divide the reconfigurable showerhead into a plurality of zones.

In some embodiments, a method of configuring a reconfigurable showerhead may include providing a body having one or more plenums disposed therein, a plurality of passageways configured to allow a flow of gas from a gas supply to the one or more plenums, and a plurality of conduits coupling the one or more plenums to a substrate-facing surface of the reconfigurable showerhead; and inserting one or more inserts within the one or more plenums to divide the reconfigurable showerhead into a plurality of zones.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIGS. 5A-D depict various configurations of a reconfigurable showerhead in accordance with embodiments of the present invention.

Figure 1:
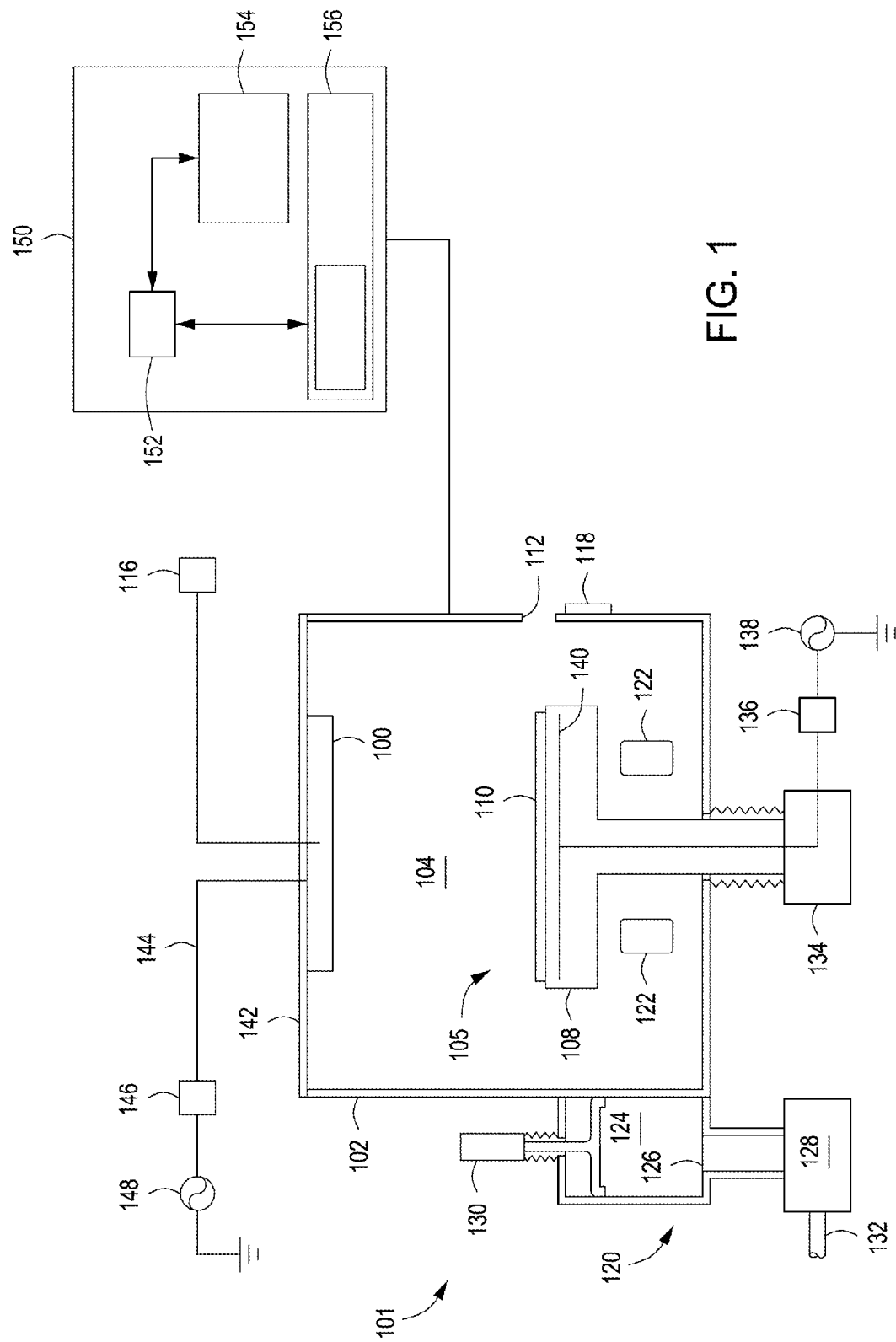
FIG. 1 depicts a process chamber having a reconfigurable showerhead in accordance with some embodiments of the invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention relate to reconfigurable showerheads used in process chambers for substrate processing, such as in the manufacture of electronic devices. The reconfigurable showerhead advantageously provides a plurality of configurations of independent zones for providing process gases to a process chamber within a single, reconfigurable showerhead. The reconfigurable showerhead thus provides a customizable gas distribution apparatus that can advantageously be utilized in place of a plurality of conventional, non-customizable showerheads. The reconfigurable showerhead may further advantageously provide uniform gas distribution across each zone in the showerhead, regardless of the configuration of zones.

FIG. 1 depicts an exemplary apparatus 101 that may comprise a process chamber 102 having a reconfigurable showerhead 100 in accordance with some embodiments of the present invention. Exemplary process chambers suitable for use with the inventive reconfigurable showerhead of the present invention may include the DPS®, ENABLER®, ADVANTEDGE™, or other process chambers, available from Applied Materials, Inc. of Santa Clara, Calif., amongst others. It is contemplated that other process chambers that use showerheads or similar gas distribution apparatus may benefit from the inventive methods disclosed herein.

The process chamber 102 has an inner volume 105 that may include a processing volume 104. The processing volume 104 may be defined, for example, between a substrate support 108 for supporting a substrate 110 during processing and one or more gas inlets, such as the showerhead 100 and/or nozzles provided at desired locations. In some embodiments, the substrate support 108 may include a mechanism that retains or supports the substrate 110 on the surface of the substrate support 108, such as an electrostatic chuck, a vacuum chuck, a substrate retaining clamp, or the like (not shown). In some embodiments, the substrate support 108 may include mechanisms for controlling the substrate temperature (such as heating and/or cooling devices, not shown) and/or for controlling the species flux and/or ion energy proximate the substrate surface.

In some embodiments, the substrate support 108 may include an RF bias electrode 140, which may be coupled to one or more bias power sources (one bias power source 138 shown) through one or more respective matching networks (matching network 136 shown). The one or more bias power sources may be capable of producing up to 3000 W at a frequency of about 2 MHz, or about 13.56 MHz, or about 60 MHz. In some embodiments, two bias power sources may provided at frequencies of about 2 MHz and about 13.56 MHz. The at least one bias power source may provide either continuous or pulsed power. In some embodiments, the bias power source may be a DC or pulsed DC source.

An opening 112 may be provided in a wall of the process chamber 102 to facilitate ingress and egress of the substrate 110. The opening 112 may be selectively sealed via a slit valve 118, or other mechanism for selectively providing access to the interior of the chamber through the opening 112. The substrate support 108 may be coupled to a lift mechanism 134 that may control the position of the substrate support 108 between a lower position (as shown) suitable for transferring substrates into and out of the chamber via the opening 112 and a selectable upper position suitable for processing. The process position may be selected to maximize process uniformity for a particular process. When in at least one of the elevated processing positions, the substrate support 108 may be disposed above the opening 112 to provide a symmetrical processing region.

The showerhead 100 may be coupled to a gas supply 116 for providing one or more process gases into the processing volume 104 of the process chamber 102. Additional gas inlets may be provided such as nozzles or inlets disposed in the ceiling or on the sidewalls of the process chamber 102 or at other locations suitable for providing gases as desired to the process chamber 102, such as the base of the process chamber, the periphery of the substrate support pedestal, or the like.

In some embodiments, the apparatus may utilize capacitively coupled RF power provided to an upper electrode proximate an upper portion of the process chamber 102. For example, the upper electrode may be a conductor formed, at least in part, by one or more of a ceiling 142, the showerhead 100, or the like, fabricated from a suitable conductive material. One or more RF power sources (one RF power source 148 shown in FIG. 1) may be coupled through one or more respective matching networks (matching network 146 shown in FIG. 1) to the upper electrode (via a conductor 144 as shown in FIG. 1). The one or more plasma sources may be capable of producing, for example, up to 5000 W at a frequency of about 60 MHz and/or about 162 MHz. In some embodiments, two RF power sources may be coupled to the upper electrode through respective matching networks for providing RF power at frequencies of about 60 MHz and about 162 MHz. In some embodiments, two RF power sources may be coupled to the upper electrode through respective matching networks for providing RF power at frequencies of about 40 MHz and about 100 MHz.

Figure 2:
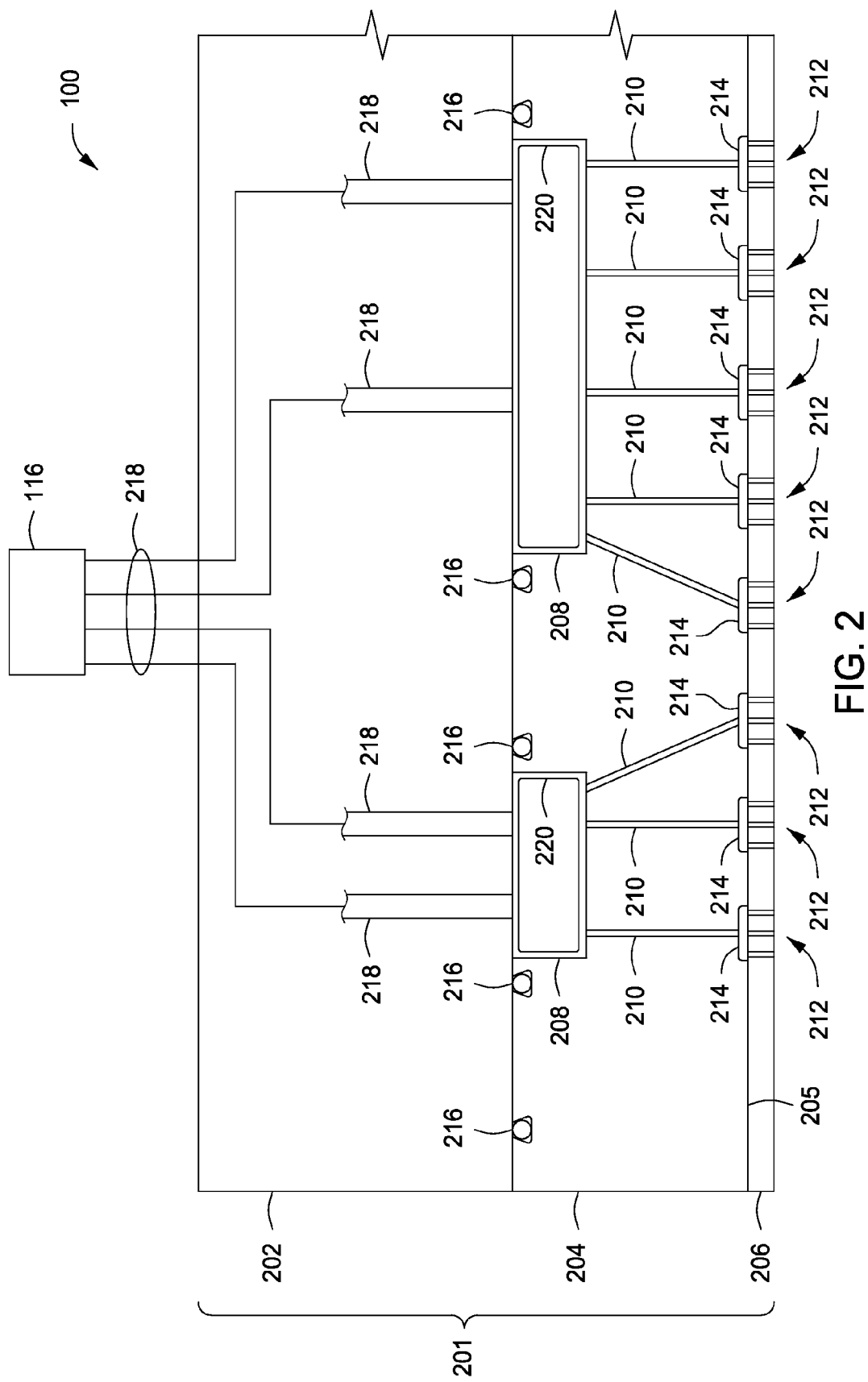
FIG. 2 depicts a schematic partial cross-sectional view of a reconfigurable showerhead in accordance with some embodiments of the present invention.
Figure 6:
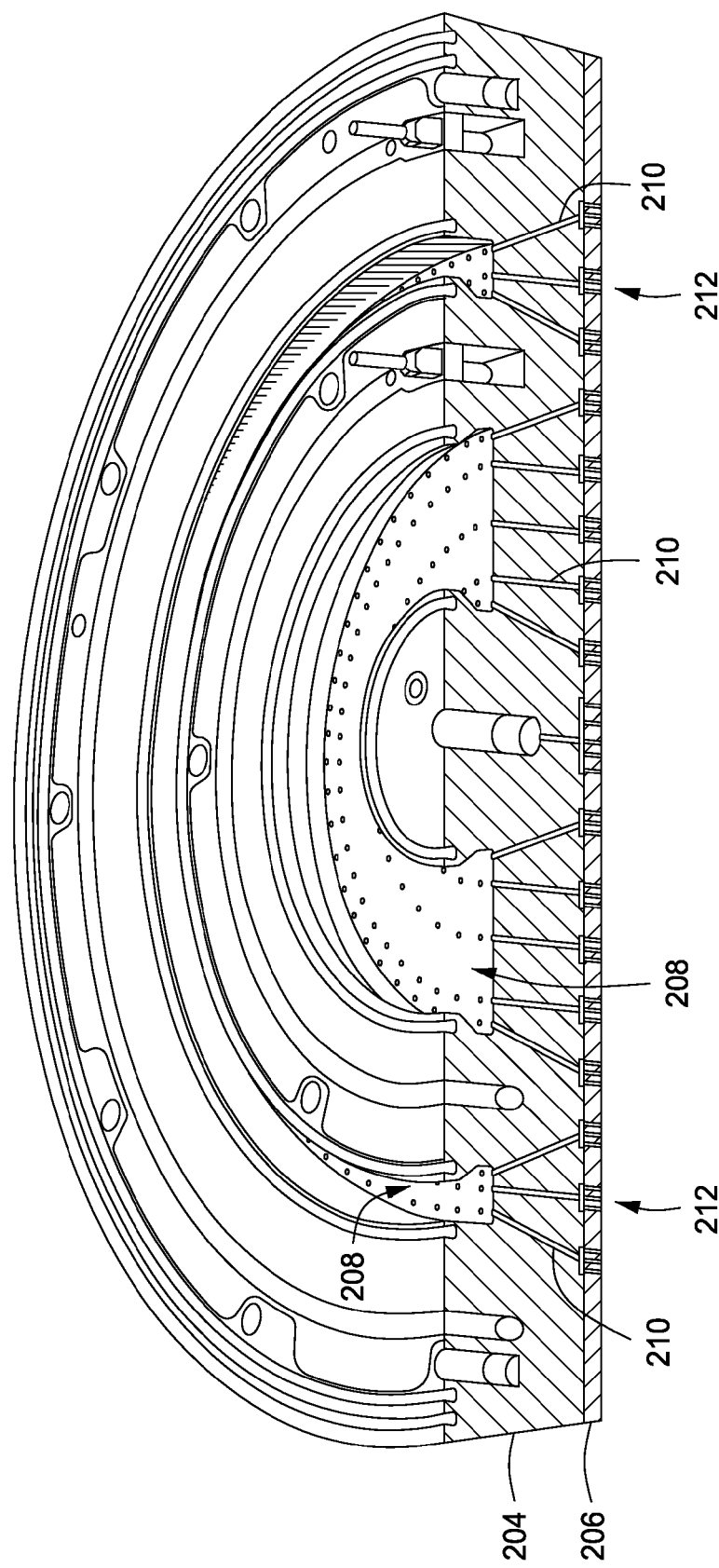
FIG. 6 illustratively depicts a partial perspective view, in cross-section, of a reconfigurable showerhead in accordance with some embodiments of the invention.

Embodiments of the showerhead 100 is described in more detail below. For example, FIG. 2 depicts a schematic partial cross-sectional view of the showerhead 100 in accordance with some embodiments of the present invention. As shown in FIG. 2, in some embodiments, the showerhead 100 may include a body 201 having one or more plenums 208 disposed therein (FIG. 6 illustratively depicts a partial perspective view, in cross-section, of the reconfigurable showerhead 100 in accordance with some embodiments of the invention). The plenums 208 are coupled to the gas supply 116, which may provide one or more gases or gaseous mixtures to the showerhead 100. A plurality of conduits 210 are provided to couple the plenums 208 to a substrate-facing side 205 of the body 201.

Figure 7:
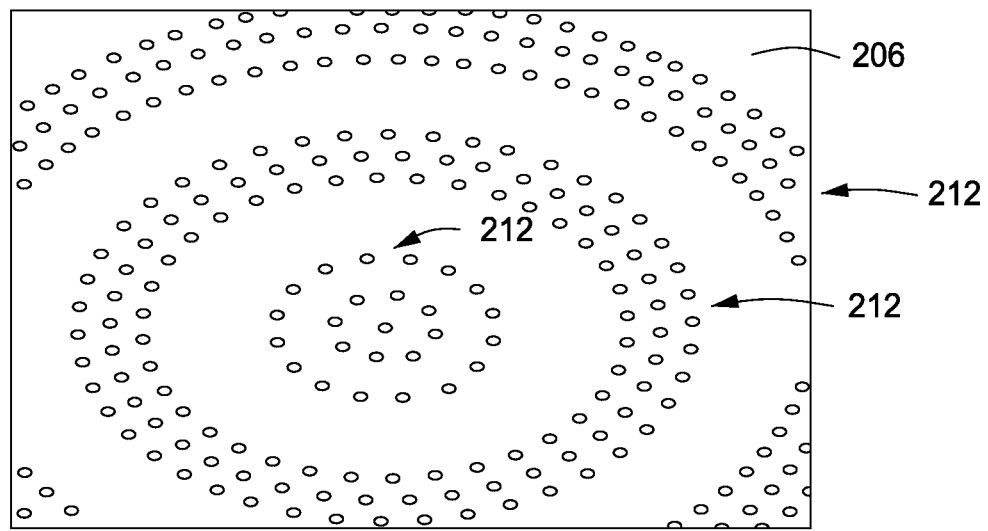
FIG. 7 illustratively depicts a partial perspective view of a faceplate of a showerhead showing an illustrative configuration of a plurality of gas distribution holes in accordance with some embodiments of the invention.
Figure 8:
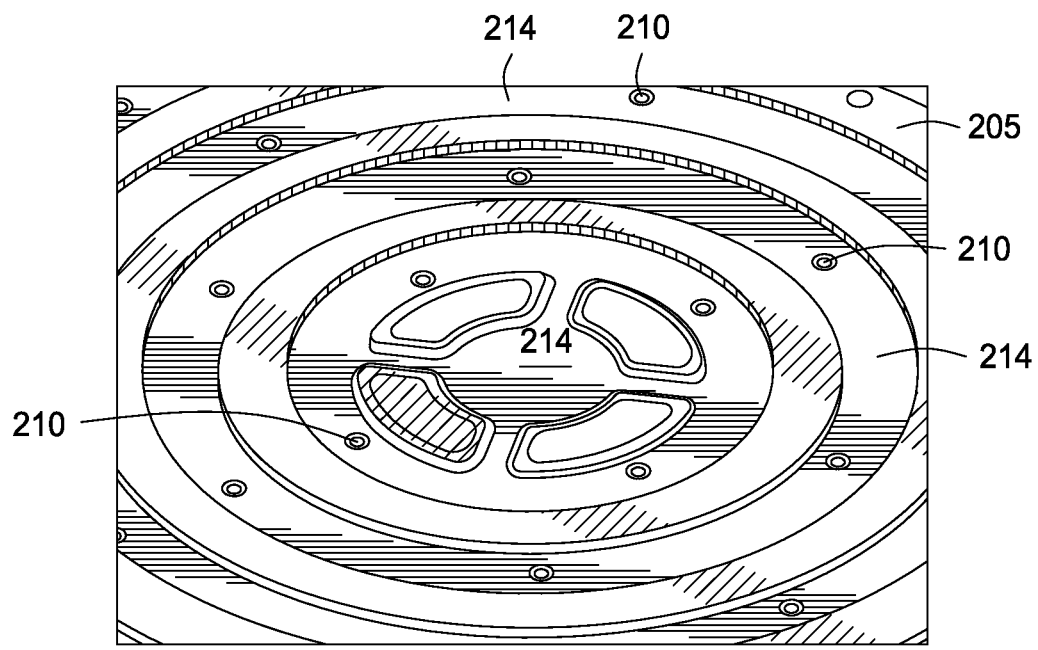
FIG. 8 illustratively depicts a partial perspective view of a substrate-facing side of the body of the showerhead showing an illustrative configuration of recesses and conduits in accordance with some embodiments of the invention.

A faceplate 206 may be disposed adjacent the substrate-facing side 205 of the body 201 and may include a plurality of holes 212 corresponding to the plurality of conduits 210 (FIG. 7 illustratively depicts a partial perspective view of the faceplate 206 showing an illustrative configuration of the plurality of holes 212 in accordance with some embodiments of the invention). In some embodiments, a recess 214 may be provided in the substrate-facing side 205 of the body 201 (or alternatively in the faceplate 206, or partially in both the body and the faceplate) to couple a plurality of the plurality of holes 212 to a single one of the conduits 210 (FIG. 8 illustratively depicts a partial perspective view of the substrate-facing side 205 of the body 201 showing an illustrative configuration of recesses 214 and conduits 210 in accordance with some embodiments of the invention). In some embodiments, the faceplate 206 may be bonded to the substrate-facing side of the body 201.

In some embodiments, the body 201 may include a first plate 202 and a second plate 204 that may be removably coupled together by suitable fasteners (such as bolts, clamps, or the like). The plenums 208 may be formed by a recess formed in either or both of the first plate 202 or the second plate 204. In the embodiment depicted in FIG. 2, the plenums 208 are shown formed in the second plate 204. Seals 216 (such as o-rings, gaskets, or the like) may be provided between the first and second plates 202, 204 proximate the plenums 208 or elsewhere as desired to limit or prevent leakage of process gases. The two-plate design advantageously facilitates ease of maintenance, reconfiguration, and cleaning of the showerhead 100.

As noted above, the plenums 208 are coupled to the gas supply 116, which may provide one or more gases or gaseous mixtures to the showerhead 100. For example, a plurality of passageways 218 may be provided in the body 201 (or in the first plate 202, as shown in FIG. 2) to couple the gas supply 116 to the plenums 208. The gas supply 116 may independently provide one or more gases or gaseous mixtures to each plenum via the passageways 218. Thus, process gases may be provided at independent flow rates and compositions to each plenum 208. As shown in FIG. 2, each plenum 208 may be coupled to the gas source via a plurality of passageways 218. As such, each plenum 208 is capable of receiving one or more gases or gaseous mixtures independently.

Figure 3:
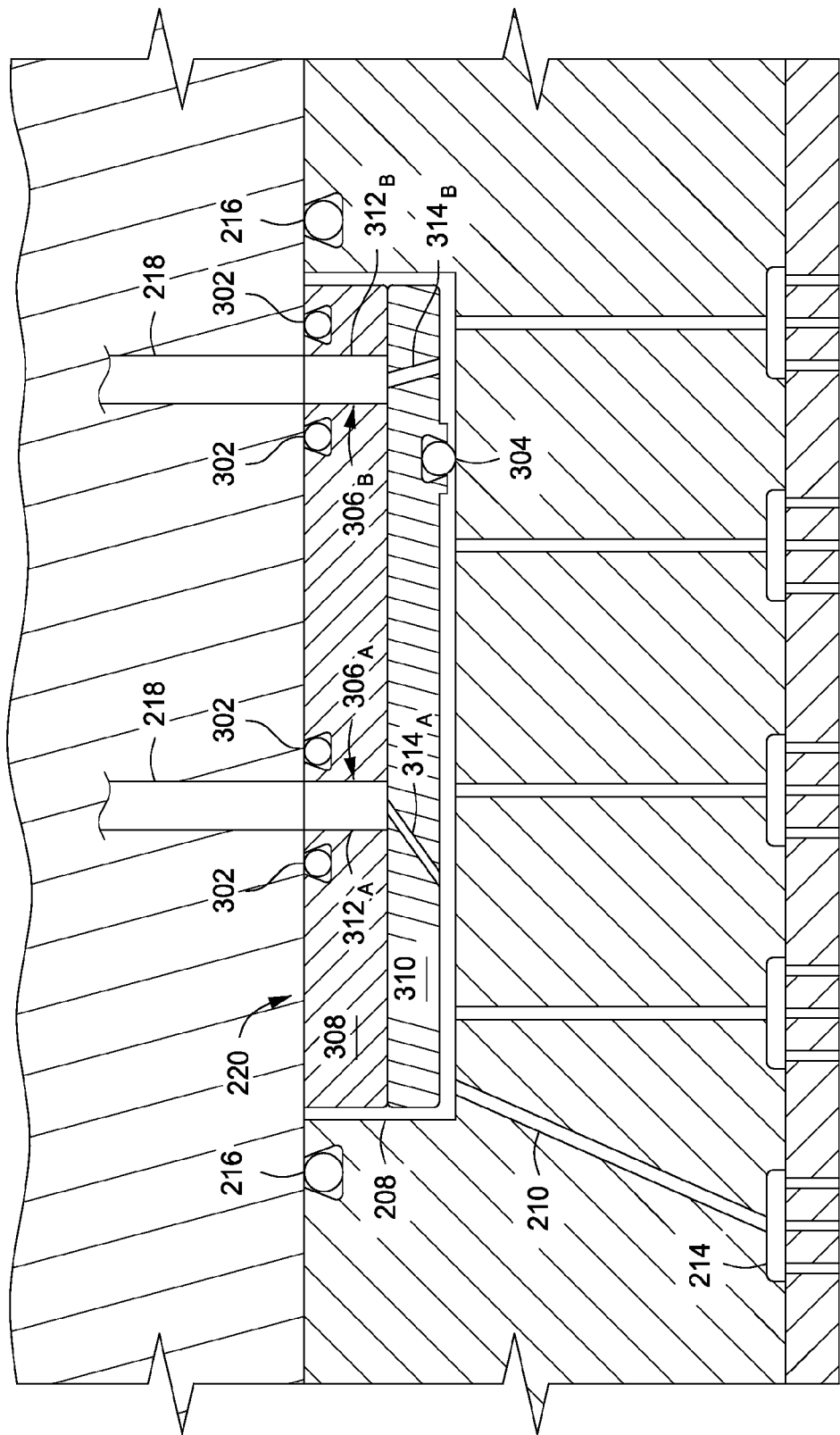
FIG. 3 depicts a schematic side view of an insert for use in a showerhead reconfigurable showerhead in accordance with some embodiments of the present invention.

An insert 220 may be provided within each plenum 208. In some embodiments, insert 220 may advantageously divide the plenum 208 into two or more plenums. For example, FIG. 3 depicts a schematic side view of an insert 220 in accordance with some embodiments of the present invention. The insert 220 includes seals 302 (such as o-rings or the like) to isolate each passageway 218 coupled to the gas source 116. As illustratively depicted in FIG. 3, two passageways 218 are provided in the plenum 208, each isolated by seals 302. By isolating the passageways 218, independent gas compositions or flow rates may advantageously be provided by the gas source 116 to a common plenum 208 without mixing in the common plenum 208.

In some embodiments, one or more seals 304 may be provided between the insert 220 and walls of the plenum 208 to split the plenum 208 into two or more zones. Although one seal 304 is shown disposed on a lower surface of the insert 220 (in the frame of reference of the drawing), additional seals 304 may be provided on the upper surface of the insert if desired.

In some embodiments, independent flow paths 306 (306A and 306B shown in FIG. 3) may be provided through the insert 220 to maintain the independence of the gas compositions or flow rates. The independent flow paths are generally disposed between a respective passageway 218 and a particular zone of the plenum 208 created by the seal 304 of the insert 220. As such, the insert 220 may create a plurality of zones and may facilitate providing independent gas compositions or flow rates to those zones, even though disposed within the same plenum.

In some embodiments, the insert 220 may comprise a body 308 and a cap 310. Portions of the independent flow paths 306 may be provided in the body 308 with another portion of the independent flow paths 306 provided through the cap 310. For example, as depicted in FIG. 3, flow paths 312A and 312B may be provided in the body 308 and flow paths 314A and 314B may be provided in the cap 310.

Figure 4A:
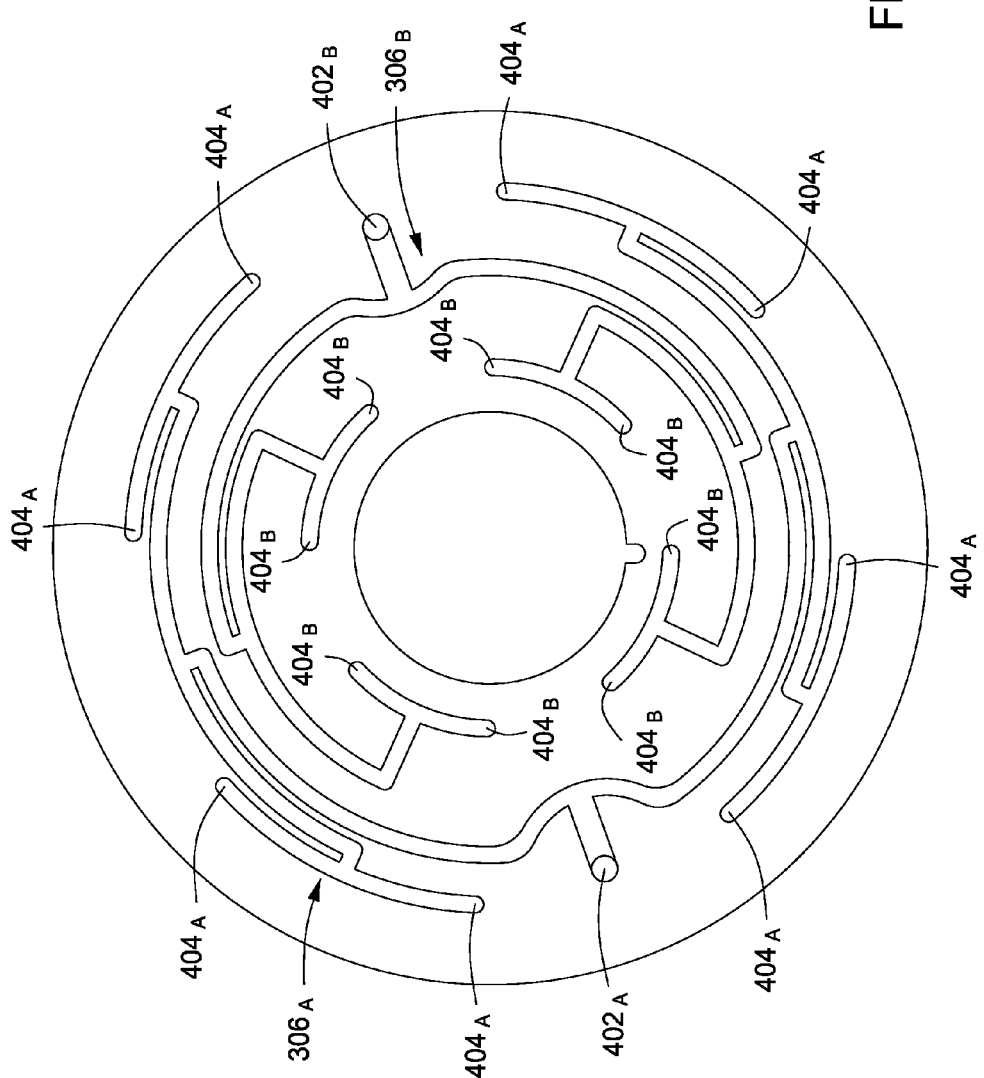
FIGS. 4A-D depict various embodiments of recursive flow paths that may be provided by each insert in accordance with embodiments of the present invention.

In some embodiments, the insert 220 may advantageously provide more uniform distribution of the process gases exiting the plenums 208 via the conduits 210. For example, FIGS. 4A-D depict various embodiments of recursive flow paths that may be provided by each insert in accordance with embodiments of the present invention. As shown in FIG. 4A, each flow path 306A, 306B may spread from a single inlet (e.g., inlets 402A, 402B) to a plurality of outlets (e.g., outlets 404A, 404B) within the plenum 208. In some embodiments, the flow paths 306A, 306B may spread recursively to the plurality of outlets via a plurality of passages.

In some embodiments, the plurality of passages may have a substantially equal conductance. As used herein, the term substantially equivalent, or substantially equal, means within about 10 percent of each other). The terms substantially equivalent or substantially equal, as defined above, may be used to describe other aspects of the invention, such as conduit (or passage) length, flow length, cross-sectional area, or the like.

In some embodiments, the plurality of passages may have a substantially equal flow length. In some embodiments, the plurality of passages may have a substantially equal cross-sectional area along an equivalent position there along (e.g., the cross-sectional area may vary along the length of each passage, but each passage in the plurality will vary in a substantially equivalent manner). In some embodiments, the plurality of passages may be symmetrically arranged about the insert.

Figure 4B:
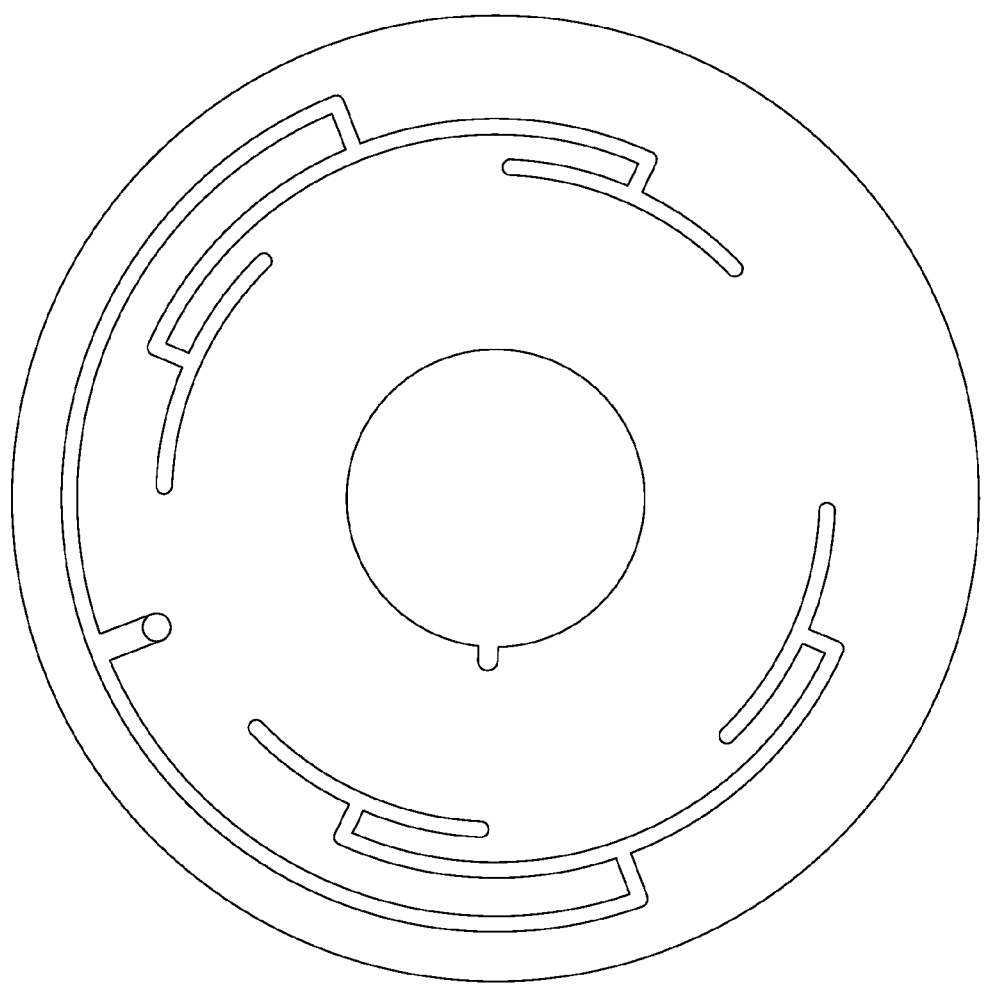
Figure 4C:
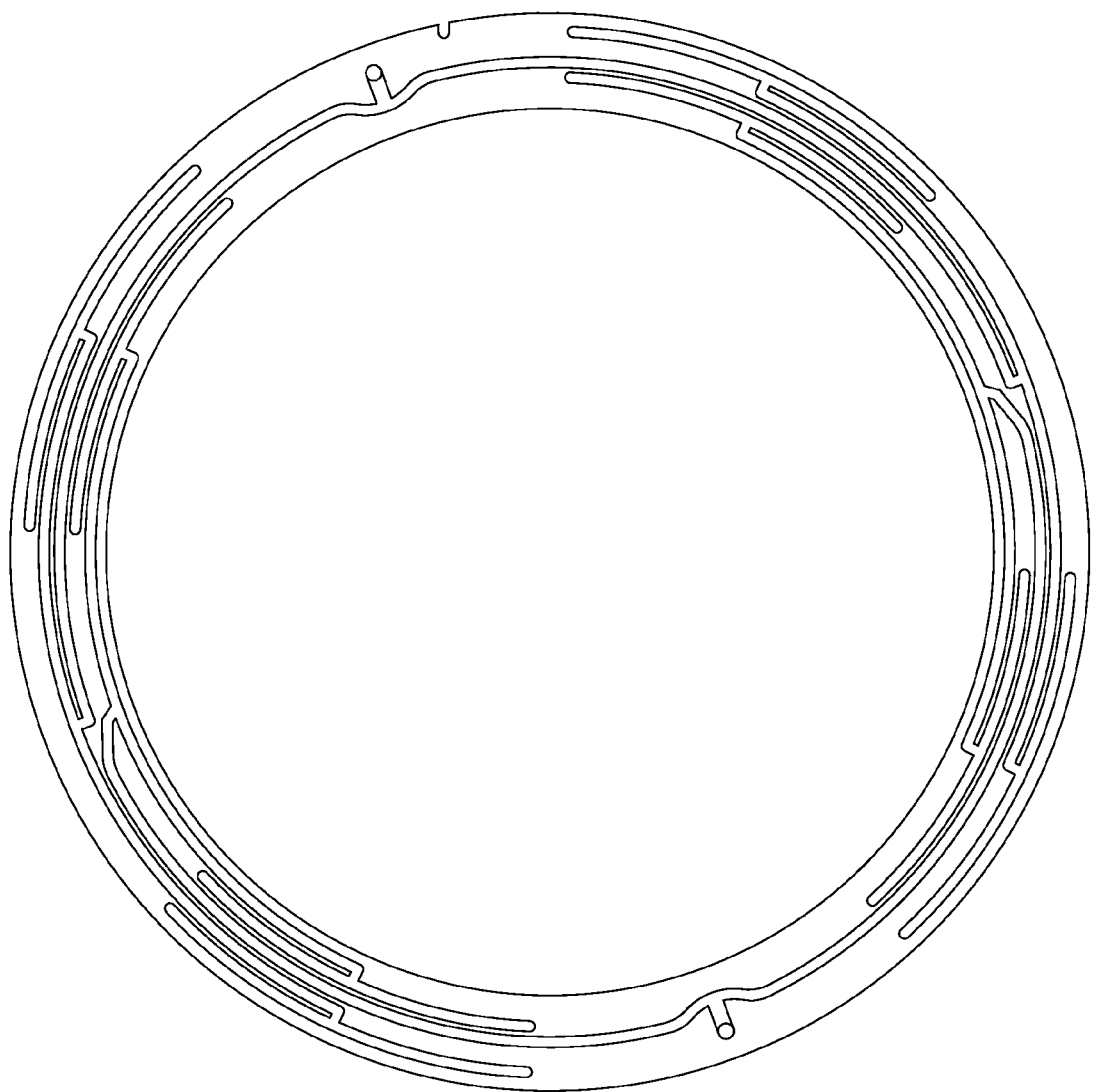
Figure 4D:
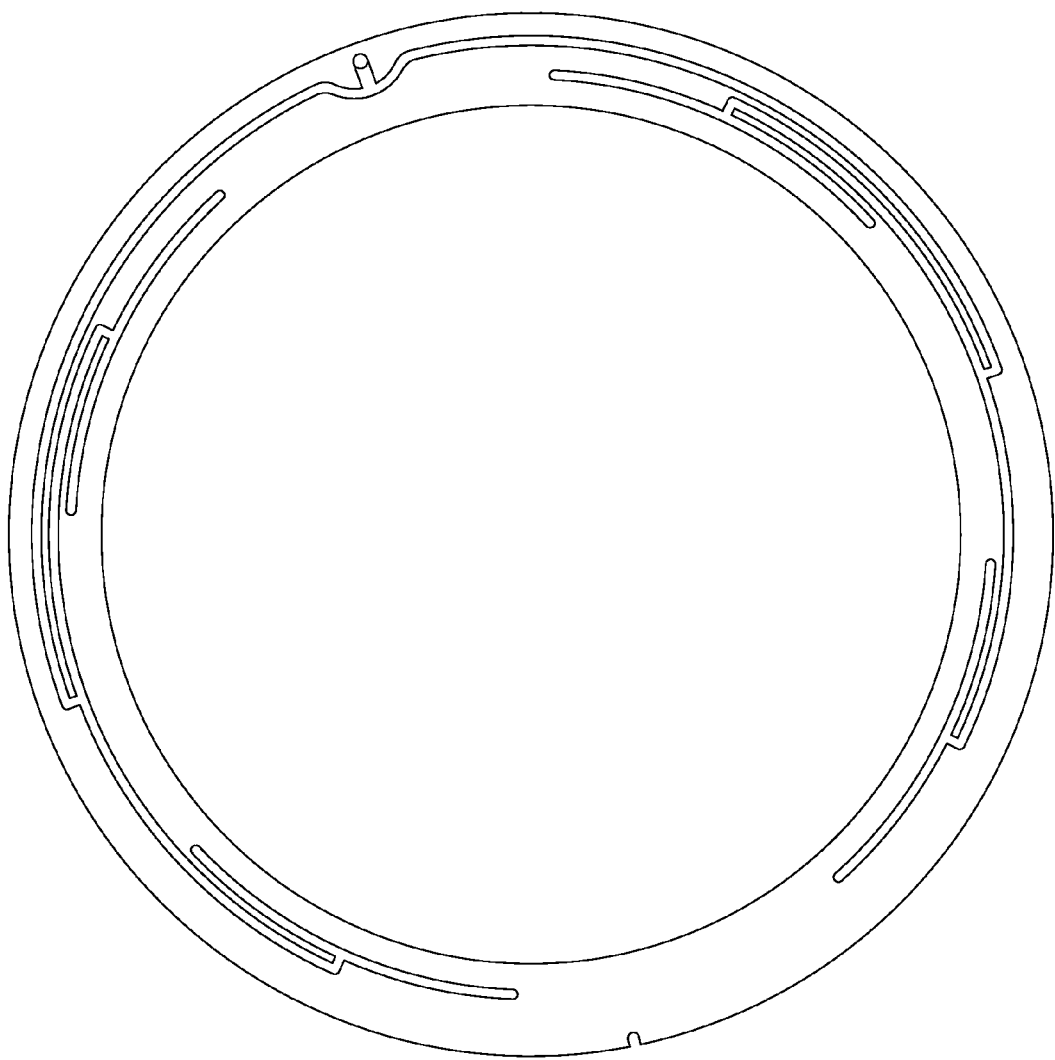

FIG. 4B depicts an insert 220 having a single flow path 306 that recursively spreads from a single inlet to a plurality of outlets. FIGS. 4C-D illustratively depict different sized inserts for use in different sized plenums 208. For example, a showerhead may be provided with an inner plenum and an outer plenum having different radial widths and appropriately sized inserts may be provided for use in each plenum. In some embodiments, the inserts 220 may provide both more uniform gas distribution and plenum division. For example, see plenums 208 depicted in FIGS. 2 and 6.

The reconfigurable showerhead 100 may be assembled with different configurations of inserts as desired for particular processes. Thus, the reconfigurable showerhead 100 may be utilized for a wide variety of processes that would otherwise required different showerheads for each process. As each showerhead is very expensive, the reconfigurable showerhead 100 advantageously saves cost and makes wider processing options available to companies that otherwise could not afford or would prefer not to pay for an array of showerheads configured for different processes.

Figure 5A:
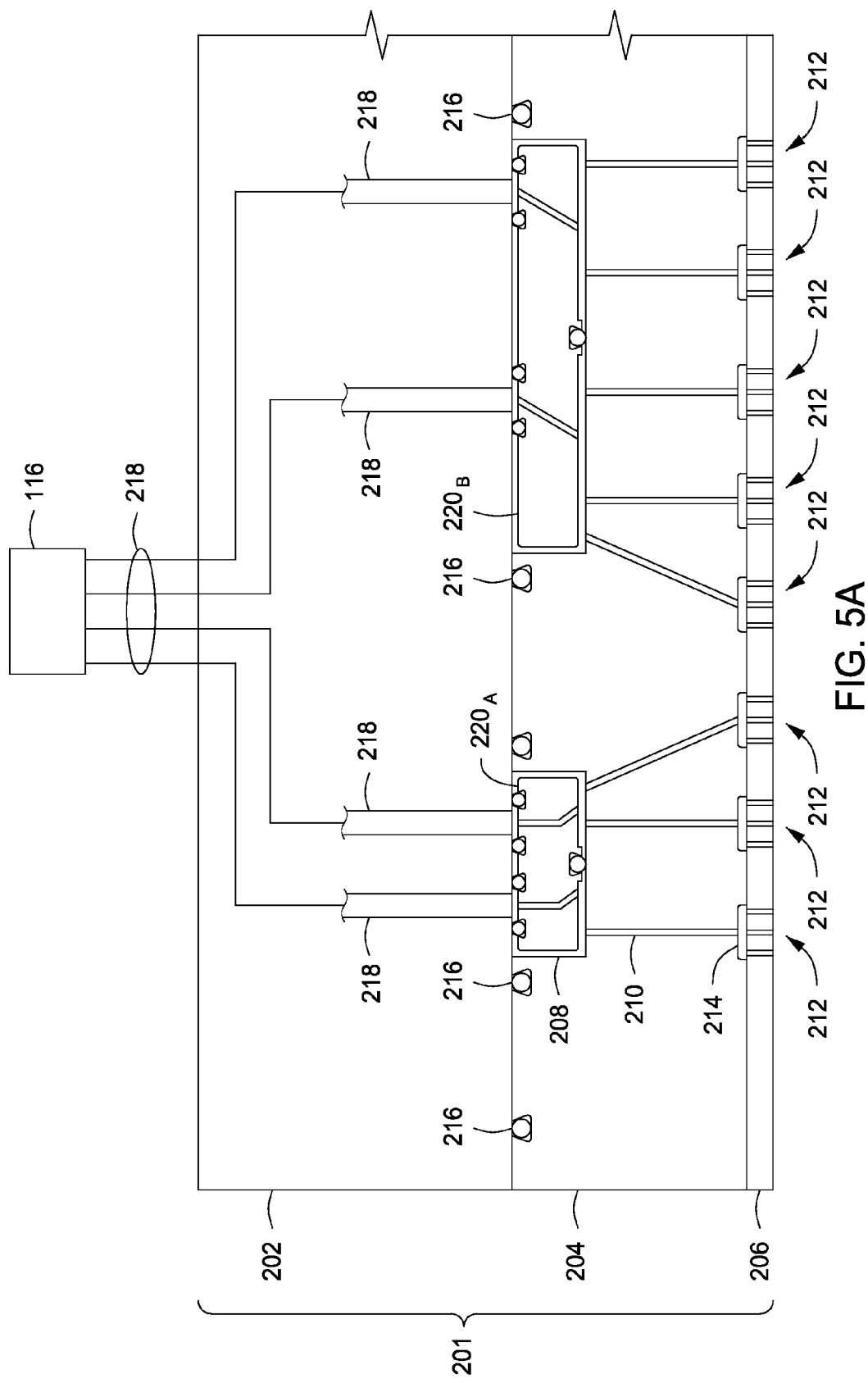
Figure 5B:
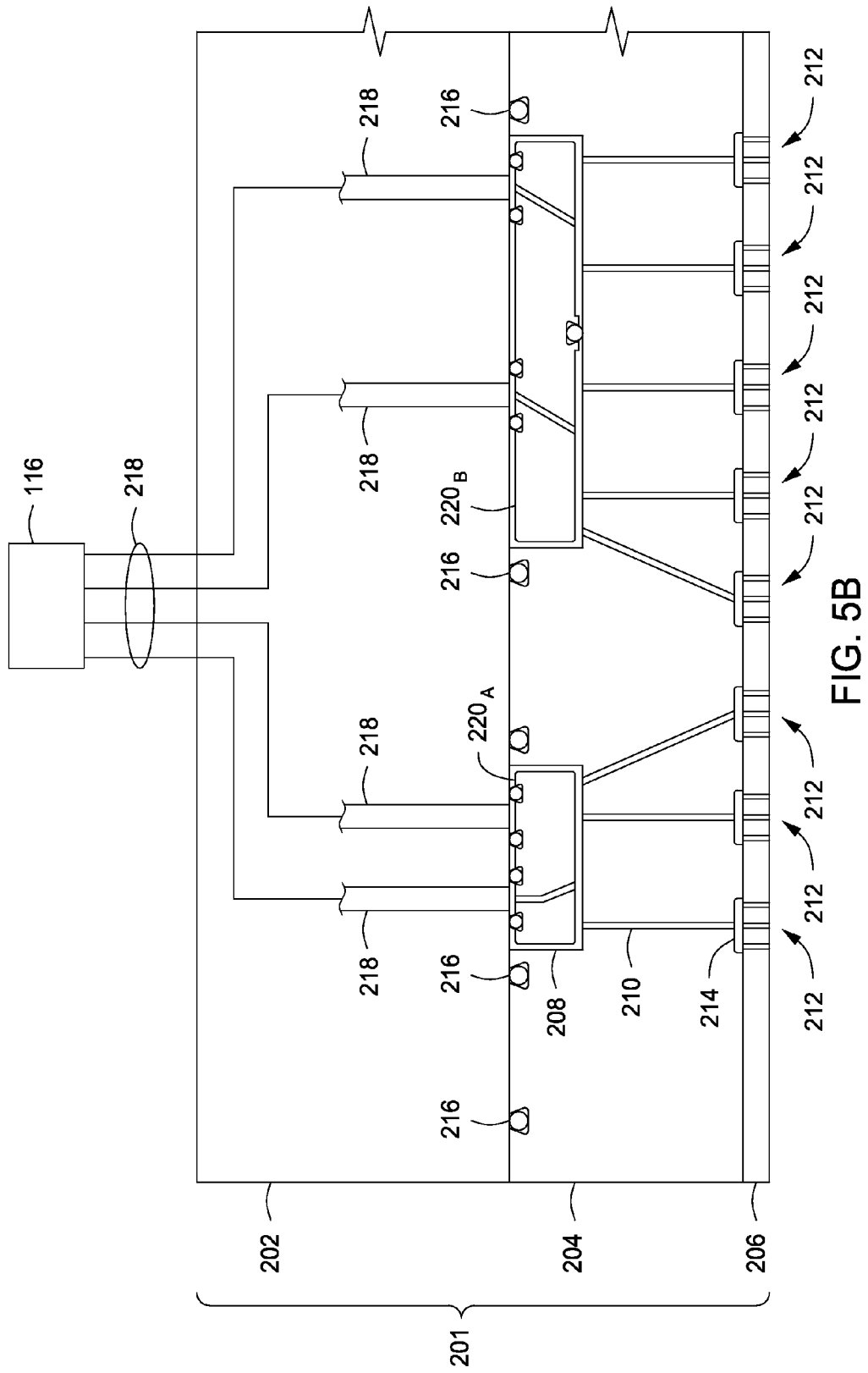
Figure 5C:
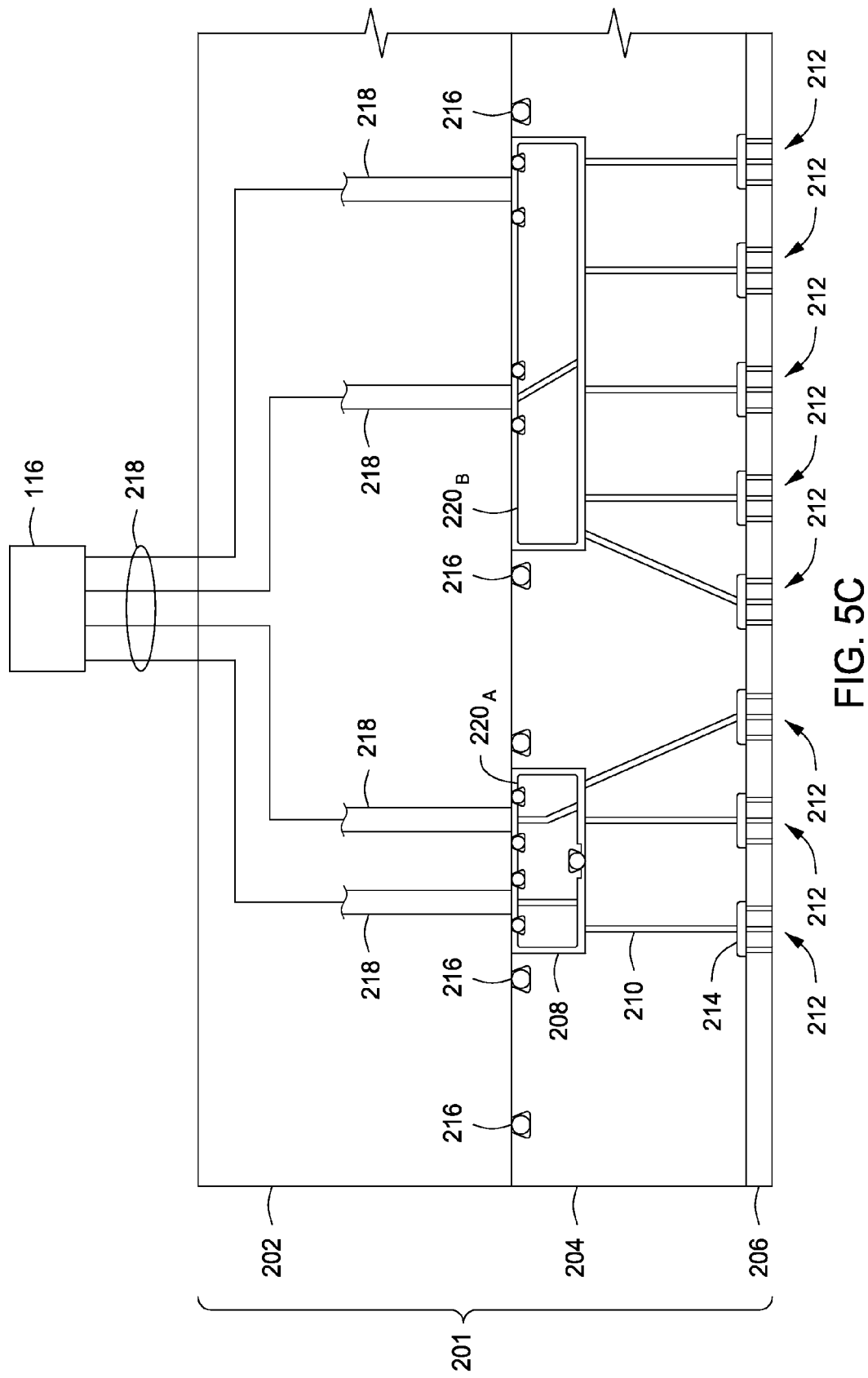

For example, FIGS. 5A-D depict various configurations of a reconfigurable showerhead in accordance with embodiments of the present invention. As depicted in FIGS. 5A-D, a reconfigurable showerhead 100 provided with two plenums may be illustratively configured as a two zone, a three zone, or a four zone showerhead. For example, FIG. 5A depicts each plenum 208 split into two zones by the inserts 220A and 220B. FIG. 5B depicts an inner plenum 208 (on the right in FIGS. 5A-D) split into two zones by the insert 220B, and an insert 220A that does not split the outer plenum 208 (on the left in FIGS. 5A-D). In such embodiments, a seal may be provided (as shown) to isolate any unused passageways 218. Alternatively or in combination, other ways to halt the flow of gases through the unused passageway 218 may be provided, such as caps, valves, setting flow controllers to zero (or off), or the like. FIG. 5C depicts the reverse of FIG. 5B, where an outer plenum 208 is split into two zones by the insert 220A, and the insert 220B does not split the inner plenum 208. FIG. 5D depicts a configuration where all plenums are not split by the inserts.

Thus, each plenum 208 and insert 220 operate in combination with the number of passageways 218 coupled to the gas supply 116 and with the number of conduits 210 leading to the substrate facing side of the body 201 to selectively and reversibly configure the showerhead 100 into a desired number of zones. The inserts may further provide a more uniform distribution of gas within each zone, as discussed above. Such configuration options advantageously enable the use of different zone configurations as desired for certain processes without the expense of multiple showerheads. For example, in some processes, substrate edge critical dimension (CD) non-uniformity cannot be fixed with the process kit on the substrate support. By reconfiguring the showerhead to provide an additional zone proximate the edge of the substrate, an independent gas may be provided to the edge of the substrate to facilitate control over CD uniformity proximate the substrate edge. In another example, in some processes, etch rate non-uniformity proximate the center of the substrate may be improved by reconfiguring the showerhead to provide an additional zone proximate the center of the substrate to provide an independent gas to the center of the substrate to facilitate control over etch rate uniformity proximate the substrate center.

Returning to FIG. 1, the exhaust system 120 generally includes a pumping plenum 124 and a plurality of conduits that couple the pumping plenum 124 to the inner volume 105 (and generally, the processing volume 104) of the process chamber 102. Each conduit has an inlet 122 coupled to the inner volume 105 (or, in some embodiments, the exhaust volume 106) and an outlet (not shown) fluidly coupled to the pumping plenum 124. For example, each conduit may have an inlet 122 disposed in a lower region of a sidewall or a floor of the process chamber 102. In some embodiments, the inlets are substantially equidistantly spaced from each other.

A vacuum pump 128 may be coupled to the pumping plenum 124 via a pumping port 126 for pumping out the exhaust gases from the process chamber 102. The vacuum pump 128 may be fluidly coupled to an exhaust outlet 132 for routing the exhaust as required to appropriate exhaust handling equipment. A valve 130 (such as a gate valve, or the like) may be disposed in the pumping plenum 124 to facilitate control of the flow rate of the exhaust gases in combination with the operation of the vacuum pump 128. Although a z-motion gate valve is shown, any suitable, process compatible valve for controlling the flow of the exhaust may be utilized.

In some embodiments, the exhaust system 120 may facilitate uniform flow of the exhaust gases from the inner volume 105 of the process chamber 102. For example, the exhaust system 120 may provide at least one of reduced variance of flow resistance azimuthally (or symmetrically) about the substrate support 108 (e.g., substantially equal flow resistance), or substantially equal residence time for the exhaust flow to the pump. Accordingly, in some embodiments, the plurality of conduits may have a substantially equal conductance. In some embodiments, the plurality of conduits may have a high conductance, or a high conductance as compared to the pump speed.

In some embodiments, the plurality of conduits may have a substantially equal flow length. In some embodiments, the plurality of conduits may have a substantially equal cross-sectional area along an equivalent position there along (e.g., the cross-sectional area may vary along the length of each conduit, but each conduit in the plurality will vary in a substantially equivalent manner). In some embodiments, the plurality of conduits may be symmetrically arranged about the process chamber. In some embodiments, the plurality of conduits may be symmetrically arranged about a vertical plane passing through pumping port 126 and the substrate support 108 of the process chamber 102.

A controller 150 may be provided to facilitate control of the process chamber 102. The controller 150 may be one of any form of general-purpose computer processor that can be used in an industrial setting for controlling various chambers and sub-processors. The memory, or computer-readable medium, 156 of the CPU 152 may be one or more of readily available memory such as random access memory (RAM), read only memory (ROM), floppy disk, hard disk, or any other form of digital storage, local or remote. The support circuits 154 are coupled to the CPU 152 for supporting the processor in a conventional manner. These circuits include cache, power supplies, clock circuits, input/output circuitry and subsystems, and the like.

Thus, reconfigurable showerheads for use in process chambers for substrate processing, such as in the manufacture of electronic devices, have been provided herein. The reconfigurable showerhead advantageously provides a plurality of configurations of independent zones for providing process gases to a process chamber within a single, reconfigurable showerhead. The reconfigurable showerhead thus provides a customizable gas distribution apparatus that can advantageously be utilized in place of a plurality of conventional, non-customizable showerheads. The reconfigurable showerhead may further advantageously provide uniform gas distribution across each zone in the showerhead, regardless of the configuration of zones.

While the foregoing is directed to embodiments of the present invention, other and further embodiments of the invention may be devised without departing from the basic scope thereof.

The invention claimed is:

1. A reconfigurable showerhead, comprising:
   a body having one or more annular plenums disposed therein and a plurality of passageways disposed outside of the one or more annular plenums and coupled to each plenum of the one or more annular plenums to allow gas to flow into the one or more annular plenums from each passageway, wherein each of the one or more annular plenums is coupled to a substrate-facing side of the body by a plurality of conduits disposed through the body; and
   one or more annular inserts configured to be removably disposed within the one or more annular plenums, wherein at least one of the one or more annular inserts is configured to change the number of conduits coupled to a given passageway, wherein the one or more annular inserts comprise one or more flow paths formed therein to allow a flow of gas therethrough, wherein each of the one or more flow paths spread recursively from an inlet to a plurality of outlets within the one or more annular plenums via a plurality of passages, and wherein the one or more flow paths extend from an upper surface of each of the one or more annular inserts to a substrate-facing surface of the one or more annular inserts.

2. The reconfigurable showerhead of claim 1, wherein the body comprises a first plate removably coupled to a second plate, and wherein at least one of the first plate and second plate comprise one or more recesses formed therein to form the one or more annular plenums between the first plate and the second plate when the first plate and the second plate are coupled together.

3. The reconfigurable showerhead of claim 1, further comprising:
   a faceplate disposed adjacent to the substrate-facing side of the body, wherein the faceplate comprises a plurality of holes corresponding to the plurality of conduits formed therein.

4. The reconfigurable showerhead of claim 3, further comprising:
   a recess formed in at least one of the faceplate or the substrate-facing side of the body, wherein the recess is coupled between one conduit of the plurality of conduits and at least one of the plurality of holes.

5. The reconfigurable showerhead of claim 1, wherein the one or more annular inserts further comprise a body and a cap, wherein a first portion of the one or more flow paths is formed in the body and a second portion of the one or more flow paths is formed in the cap.

6. The reconfigurable showerhead of claim 1, further comprising:
one or more seals disposed between the one or more annular inserts and walls of the one or more annular plenums to split the one or more annular plenums into two or more zones, wherein each of the two or more zones includes at least one of the one or more flow paths.

7. The reconfigurable showerhead of claim 1, wherein the plurality of passages each have a substantially equal fluid conductance.

8. The reconfigurable showerhead of claim 1, wherein the plurality of passages each have a substantially equal flow length.

9. The reconfigurable showerhead of claim 1, wherein the plurality of passages each have a substantially equal cross-sectional area along an equivalent position there along.

10. The reconfigurable showerhead of claim 1, wherein the one or more annular inserts comprises a plurality of inserts, and wherein at least a first insert of the plurality of inserts is different than at least a second insert of the plurality of inserts such that the first insert reversibly divides the reconfigurable showerhead into a first plurality of zones when removably inserted in the plenum, and the second insert reversibly divides the reconfigurable showerhead into a second plurality of zones different than the first plurality of zones when the first insert is replaced with the second insert.

11. The reconfigurable showerhead of claim 1, wherein the body includes a plurality of passageways to provide one or more process gases to each of the one or more annular plenums.

12. A substrate processing system, comprising:
a process chamber having a reconfigurable showerhead coupled to a gas supply for providing one or more process gases to the process chamber, the reconfigurable showerhead comprising a body having a plurality of annular plenums disposed therein and a plurality of passageways disposed outside each of the plurality of annular plenums and fluidly coupled to the gas supply at a first end and to each plenum of the plurality of annular plenums at an opposite end to allow gas to flow into the plurality of annular plenums from each passageway, wherein each of the plurality of annular plenums is coupled to a substrate-facing side of the body by a plurality of conduits disposed through the body, and a plurality of annular inserts removably disposed within the plurality of annular plenums, wherein the plurality of annular inserts are configured to change the number of conduits coupled to a given passageway, wherein the plurality of annular inserts each comprise one or more flow paths formed therein to allow a flow of gas therethrough, and wherein the one or more flow paths extend from an upper surface of each of the plurality of annular inserts to a substrate-facing surface of the plurality of annular inserts.

13. The substrate processing system of claim 12, wherein the body comprises a first plate removably coupled to a second plate, and wherein at least one of the first plate and second plate comprise a plurality of recesses formed therein to form the plurality of annular plenums between the first plate and the second plate when the first plate and the second plate are coupled together.

14. The substrate processing system of claim 12, wherein each of the one or more flow paths spread recursively from an inlet to a plurality of outlets within the plurality of annular plenums via a plurality of passages.

15. The substrate processing system of claim 12, wherein the plurality of annular inserts divide the plurality of conduits into at least two smaller subsets of conduits.

16. A reconfigurable showerhead, comprising:
a body having a plurality of passageways and one or more annular plenums disposed therein, wherein the plurality of passageways are disposed outside of the one or more annular plenums, wherein each of the one or more annular plenums are coupled to a substrate-facing side of the body by a plurality of conduits disposed through the body, and wherein at least two of the plurality of passageways are coupled to at least one plenum of the one or more annular plenums to allow gas to flow into the at least one plenum from each of the at least two of the plurality of passageways; and
one or more annular inserts configured to be removably disposed within the one or more annular plenums, wherein the one or more annular inserts are configured to change the number of conduits coupled to a given passageway, wherein the one or more annular inserts comprise one or more flow paths formed therein to allow a flow of gas therethrough, and wherein the one or more flow paths extend from an upper surface of each of the one or more annular inserts to a substrate-facing surface of the one or more annular inserts.

* * * * *